(12) United States Patent
Schork et al.

(10) Patent No.: US 10,511,165 B2
(45) Date of Patent: Dec. 17, 2019

(54) CIRCUIT ASSEMBLY FOR PROTECTING A UNIT TO BE OPERATED FROM A SUPPLY NETWORK AGAINST OVERVOLTAGE

(71) Applicant: DEHN + SÖHNE GMBH + CO. KG, Neumarkt/Opf. (DE)

(72) Inventors: Franz Schork, Nürnberg (DE); Ralph Brocke, Ilmenau/Oberpörlitz (DE); Thomas Böhm, Hohenfels (DE); Dominik Donauer, Parsberg (DE)

(73) Assignee: DEHN + SÖHNE GMBH + CO. KG, Neumarkt/Opf. (DE)

( * ) Notice: Subject to any disclaimer, the term of this patent is extended or adjusted under 35 U.S.C. 154(b) by 217 days.

(21) Appl. No.: 15/544,220

(22) PCT Filed: Jan. 28, 2016

(86) PCT No.: PCT/EP2016/051811
§ 371 (c)(1),
(2) Date: Jul. 17, 2017

(87) PCT Pub. No.: WO2016/128225
PCT Pub. Date: Aug. 18, 2016

(65) Prior Publication Data
US 2017/0373491 A1    Dec. 28, 2017

(30) Foreign Application Priority Data

Feb. 10, 2015  (DE) .................... 10 2015 001 680
Apr. 8, 2015   (DE) .................... 10 2015 004 523

(51) Int. Cl.
*H02H 9/04*   (2006.01)
*H01L 27/02*  (2006.01)
(Continued)

(52) U.S. Cl.
CPC ......... *H02H 9/042* (2013.01); *H01L 27/0248* (2013.01); *H02H 9/04* (2013.01);
(Continued)

(58) Field of Classification Search
CPC ............ H02H 9/04–049; H01L 27/0248–0296
See application file for complete search history.

(56) References Cited

U.S. PATENT DOCUMENTS 3,246,206 A     4/1966   Chowdhuri ................... 361/91.5
4,695,916 A *   9/1987   Satoh ....................... H02H 9/04
                                                         361/111
(Continued)

FOREIGN PATENT DOCUMENTS

CN       1242604 A    1/2000   ............. H01L 21/00
CN     101252278 A    8/2008   ............... H02H 9/04
(Continued)

OTHER PUBLICATIONS

Abstract for JP200617768A. Aug. 17, 2006. (Year: 2006).*
(Continued)

*Primary Examiner* — Ronald W Leja
*Assistant Examiner* — Christopher J Clark
(74) *Attorney, Agent, or Firm* — Bodner & O'Rourke, LLP; Gerald T. Bodner; Christian P. Bodner

(57) ABSTRACT

The invention relates to a circuit assembly for protecting a unit to be operated from a supply network against overvoltage, comprising an input having a first and a second input connection, which are connected to the supply network, an output having a first and a second output connection, to which the unit to be protected can be connected, and a protection circuit, which is provided between the first and the second input connections in order to limit the voltage present at the first and the second input connections. According to the invention, the protection circuit has a power (Continued)

Figure 1:
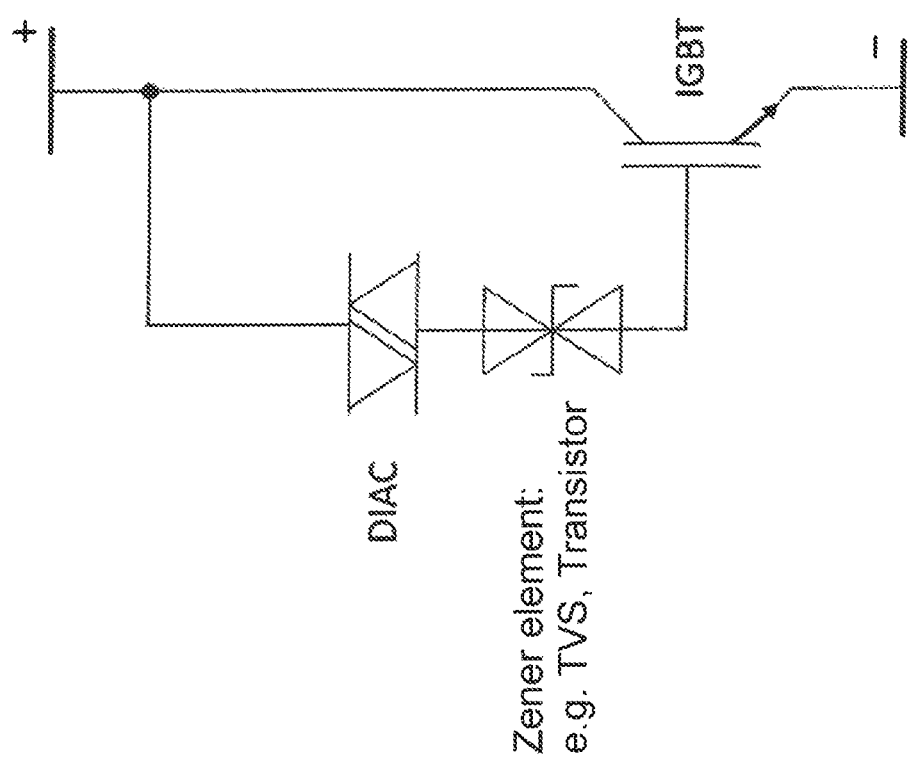

semiconductor, in particular an IGBT, wherein a series circuit consisting of a diac, i.e., a bidirectional electrode, and a Zener element is connected between the collector and the gate of the power semiconductor, wherein the sum of the Zener voltage and the diac voltage results in a clamping voltage for the power semiconductor, which lies above the voltage of the supply network and defines the protection level.

4 Claims, 3 Drawing Sheets

(51) Int. Cl.
*H03K 5/08* (2006.01)
*H03K 17/12* (2006.01)

(52) U.S. Cl.
CPC ............ *H02H 9/041* (2013.01); *H02H 9/044* (2013.01); *H03K 5/08* (2013.01); *H03K 17/12* (2013.01)

(56) References Cited

U.S. PATENT DOCUMENTS

| | | | | |
|---|---|---|---|---|
| 5,212,619 | A | 5/1993 | Baudelot et al. | 361/91.8 |
| 6,268,990 | B1 * | 7/2001 | Ogura | H03K 17/08148 327/310 |
| 7,859,814 | B2 | 12/2010 | Casey | 361/119 |
| 8,605,400 | B2 | 12/2013 | Wetter et al. | 361/91.1 |
| 8,724,276 | B2 | 5/2014 | Igl et al. | 361/91.1 |
| 2005/0007799 | A1 * | 1/2005 | Schreiber | H02M 1/425 363/132 |
| 2005/0041356 | A1 | 2/2005 | Storm et al. | 361/118 |
| 2008/0192394 | A1 | 8/2008 | Harris | 361/56 |
| 2011/0058299 | A1 | 3/2011 | Simi | 361/111 |

FOREIGN PATENT DOCUMENTS

| | | | | |
|---|---|---|---|---|
| DE | 3806288 A1 | 9/1989 | | H02H 9/04 |
| DE | 103 38 921 A1 | 3/2005 | | H02H 9/04 |
| DE | 10 2007 049928 A1 | 4/2008 | | H02H 9/04 |
| DE | 10 2009 022832 A1 | 4/2010 | | H02H 9/04 |
| DE | 102010006525 A1 | 8/2011 | | H02H 9/00 |
| EP | 0 431 215 A1 | 6/1991 | | H03K 17/082 |
| EP | 1 508 950 A2 | 2/2005 | | H02H 9/04 |
| EP | 2 256 806 A2 | 12/2010 | | H01L 27/02 |
| EP | 2 549 649 A1 | 1/2013 | | H03K 17/082 |
| EP | 2 757 688 A1 | 7/2014 | | H03K 17/082 |
| JP | 2006217768 A * | 8/2006 | | |
| WO | WO2006050568 A1 | 5/2006 | | H02H 9/02 |

OTHER PUBLICATIONS

Notification Concerning Transmittal of International Preliminary Report on Patentability (Chapter I of the Patent Cooperation Treaty), in English, dated Aug. 24, 2017, which was issued by the International Bureau of WIPO in Applicant's corresponding international PCT application having Serial No. PCT/EP2016/051811, filed on Jan. 28, 2016.

English translation of the International Preliminary Report on Patentability (Chapter I of the Patent Cooperation Treaty), dated Aug. 15, 2017, which was issued by the International Bureau of WIPO in Applicant's corresponding international PCT application having Serial No. PCT/EP2016/051811, filed on Jan. 28, 2016.

Written Opinion of the International Searching Authority, in English, dated Jun. 20, 2016, which was issued by the International Bureau of WIPO in Applicant's corresponding international PCT application having Serial No. PCT/EP2016/051811, filed on Jan. 28, 2016.

International Search Report, in English, dated Jun. 20, 2016, which was issued by the International Bureau of WIPO in Applicant's corresponding international PCT application having Serial No. PCT/EP2016/051811, filed on Jan. 28, 2016.

Office Action (in German), dated Apr. 30, 2019, issued by the German Patent Office for Applicant's corresponding German Patent Application No. DE102015004523.7, filed Apr. 8, 2015.

First Office Action (in Chinese) and an English translation thereof, dated Apr. 28, 2018, issued by the State Intellectual Property Office of the People's Republic of China for Applicant's corresponding Chinese Patent Application No. 201680009612.4, filed on Jan. 28, 2016.

* cited by examiner

CIRCUIT ASSEMBLY FOR PROTECTING A UNIT TO BE OPERATED FROM A SUPPLY NETWORK AGAINST OVERVOLTAGE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND OF THE INVENTION (1) Field of the Invention

The invention relates to a circuit assembly for protecting a unit to be operated from a supply network against overvoltage, comprising an input having a first and a second input connection, which are connected to the supply network, and an output having a first and a second output connection, to which the unit to be protected can be connected, and a protection circuit which is provided between the first and the second input connections in order to limit the voltage applied to the protection circuit, according to the preamble of claim 1.

(2) Description of Related Art

From EP 0 431 215 A1, a method and an assembly for protecting a disconnectable thyristor against inadmissible overvoltage are already known. According to the teaching therein, the anode voltage of the disconnectable thyristor is monitored with reference to its cathode voltage and when a predetermined limit value is exceeded, a control signal is generated by means of which the negative voltage source connected to the gate of the disconnectable thyristor is disconnected, and the disconnectable thyristor is turned on by means of a turn-on circuit. In this manner, disconnectable thyristors can be protected against inadmissible overvoltage.

DE 103 38 921 A1 discloses a circuit assembly for protecting against surge voltage. The task therein is based on the problem of protecting devices against surge voltage caused, for instance, by lightning on a voltage network.

The protection circuit provided in this respect comprises, in addition to a limiting device, a switch assembly. The switch assembly comprises a switching element and a control circuit for the switching element, the switching element being configured as a semiconductor device in order to ensure sufficiently precise dimensioning.

The switching device and the limiting device are arranged in series and configured such that the switching device will be conducting given a predefinable first trigger criterion and blocks given a predefined second trigger criterion.

A varistor and/or an ohmic resistance and/or a Zener diode is/are used as the limiting device. The switching element, for example, is realized as a triac and/or diac or as a thyristor or even IGBT (Insulated Gate Bipolar Transistor).

All of the embodiments according to DE 103 38 921 A1 have in common that the limiting element should be realized as a varistor, resistor or a Zener diode.

BRIEF SUMMARY OF THE INVENTION

Given the points mentioned above, it is therefore the task of the invention to propose an improved circuit assembly for protecting a unit to be operated from a supply network against overvoltage, which circuit assembly has a very rapid, safe and reproducible response behavior and can be realized in a simple manner at reasonable costs, and can be integrated in electronic assemblies.

The task of the invention is solved by a circuit assembly according to the feature combination of claim 1, the dependent claims representing at least appropriate configurations and improvements.

The inventive solution is based on the basic idea to directly use a power semiconductor as an overvoltage-limiting element while operating the power semiconductor in the clamping mode. According to the invention, the power semiconductor used is controlled via a series connection of, for instance, a diac or a thyristor diode, and a TVS or Zener diode.

The semiconductor itself is in this case provided in the transverse branch, with the control circuit, in terms of the power semiconductor, merely serving the purpose of detecting overvoltage and activating the semiconductor. Thus, the semiconductor used is utilized both as a switching and actually limiting element and performs a double function in this respect.

In a preferred configuration of the invention, the protection circuit is fed via a diode bridge communicating with the input so that negative but also positive overvoltage impulses or corresponding surge currents can be detected and dissipated.

In a further embodiment, a thyristor is connected in parallel to the semiconductor for the purpose of current splitting.

A turn-off capacitor may be further provided between the cathode of the thyristor and the emitter of the power semiconductor.

For the purpose of limiting voltage, the power semiconductor accordingly is passively controlled and operated exclusively in the clamping mode. The clamping element is composed of a series connection of a diac and a Zener element, with the sum of the Zener voltage and the diac voltage resulting in the clamping voltage. The same is set to be slightly higher than the maximum supply network frequency voltage, which may be applied for several seconds, i.e. the so-called TOV voltage. Thus, the protective level will be adjustable to its minimum possible value. The otherwise usual design of 90% below the power semiconductor's maximum voltage is not required to be observed.

In the event of overvoltage occurrence, the result will be a clamping voltage of $U_{clamp}=U_G+U_{diac}+U_{zener}$.

After exceeding the breakthrough voltage, e.g. after about 1 µs, the diac will be conducting and the clamping voltage drops. The result therefore will be $U_{clamp}=U_G+U_{zener}$.

If the Zener voltage is set exactly to the network voltage, the result will be a distinctly reduced energy consumption during the dissipating procedure in the power semiconductor.

With the thyristor's parallel connection, a further increase of the surge current-carrying capacity is possible.

In this case, the power semiconductor, in particular an IGBT, takes over the surge current in the clamping mode until the thyristor ignites.

Thereafter, the thyristor takes over the full surge current because of its low forward voltage.

The mentioned capacitor that is connected in series with the thyristor, charges up to the network voltage. Because of this, the holding current of the thyristor is fallen below, and the thyristor blocks.

Furthermore, the capacitor can be utilized for impulse evaluation in a developing manner. Depending on to what extent the capacitor comprises a charge after the overvoltage impulse, a conclusion can be drawn as to the amount of energy of the impulse.

The invention hence is based on a circuit assembly for protecting a unit to be operated from a supply network against overvoltage, comprising an input having a first and a second input connection, which are connected to the supply network. Furthermore, the circuit assembly comprises an output having a first and a second output connection, to which the unit to be protected can be connected. Furthermore, a protection circuit is provided and situated between the first and the second input connection in order to limit the voltage applied to the protection circuit.

According to the invention, the protection circuit has a power semiconductor, in particular an IGBT, wherein a series connection consisting of a diac, i.e. a bidirectional diode, and a Zener element is connected between the collector and the gate of the power semiconductor, wherein the sum of the Zener voltage and the diac voltage results in a clamping voltage for the power semiconductor, which lies above the voltage of the supply network and defines the protection level.

In a preferred embodiment of the invention, the protection circuit is fed via a diode bridge. This allows a power semiconductor device to be saved in that the relevant overvoltage or an occurring surge current is rectified and employed for controlling the (single) power semiconductor.

In the embodiment of the invention according to which a thyristor is connected in parallel to the power semiconductor for current splitting or current takeover, the thyristor's anode is connected to the collector and the thyristor's cathode to the emitter of the power semiconductor, the thyristor's gate communicating with the gate of the power semiconductor.

The turn-off capacitor is appropriately interconnected between the thyristor's cathode and the emitter of the power semiconductor.

The invention will be explained in more detail below using an exemplary embodiment and with reference to figures.

Shown are in:

BRIEF DESCRIPTION OF THE SEVERAL VIEWS OF THE DRAWINGS(S)

Figure 2:
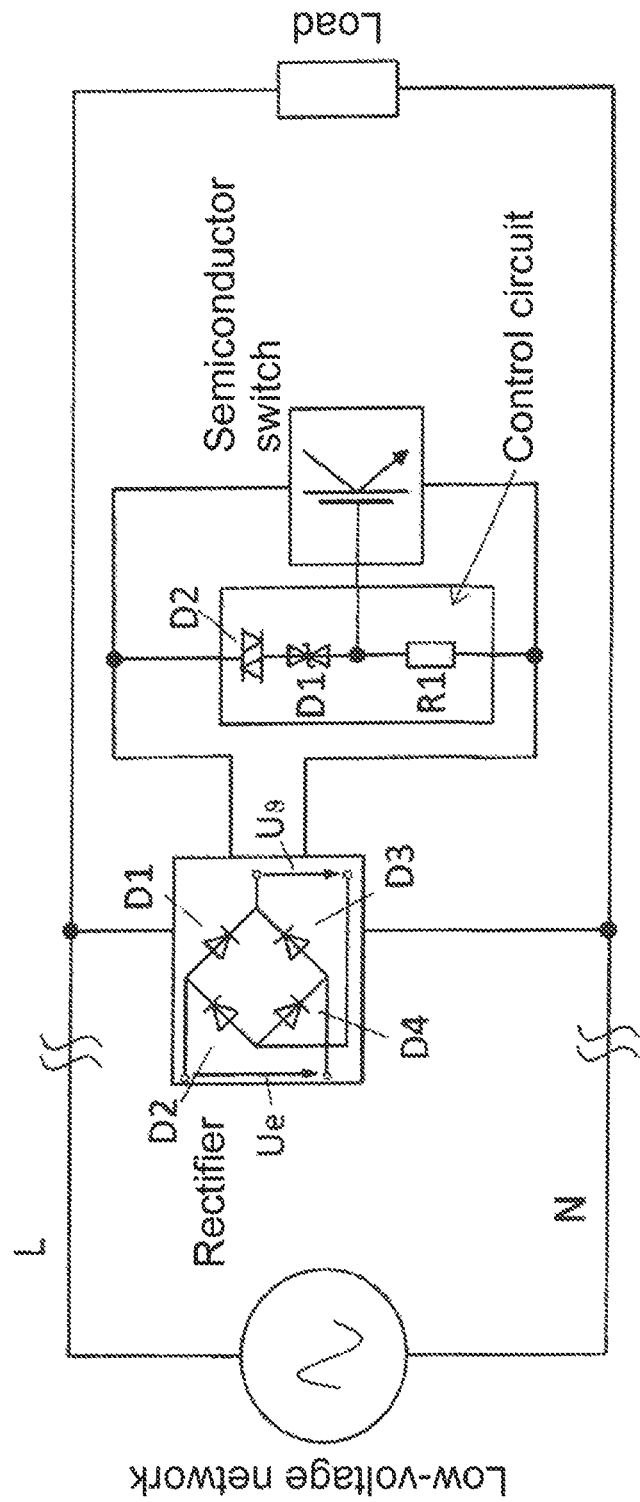
Figure 3:
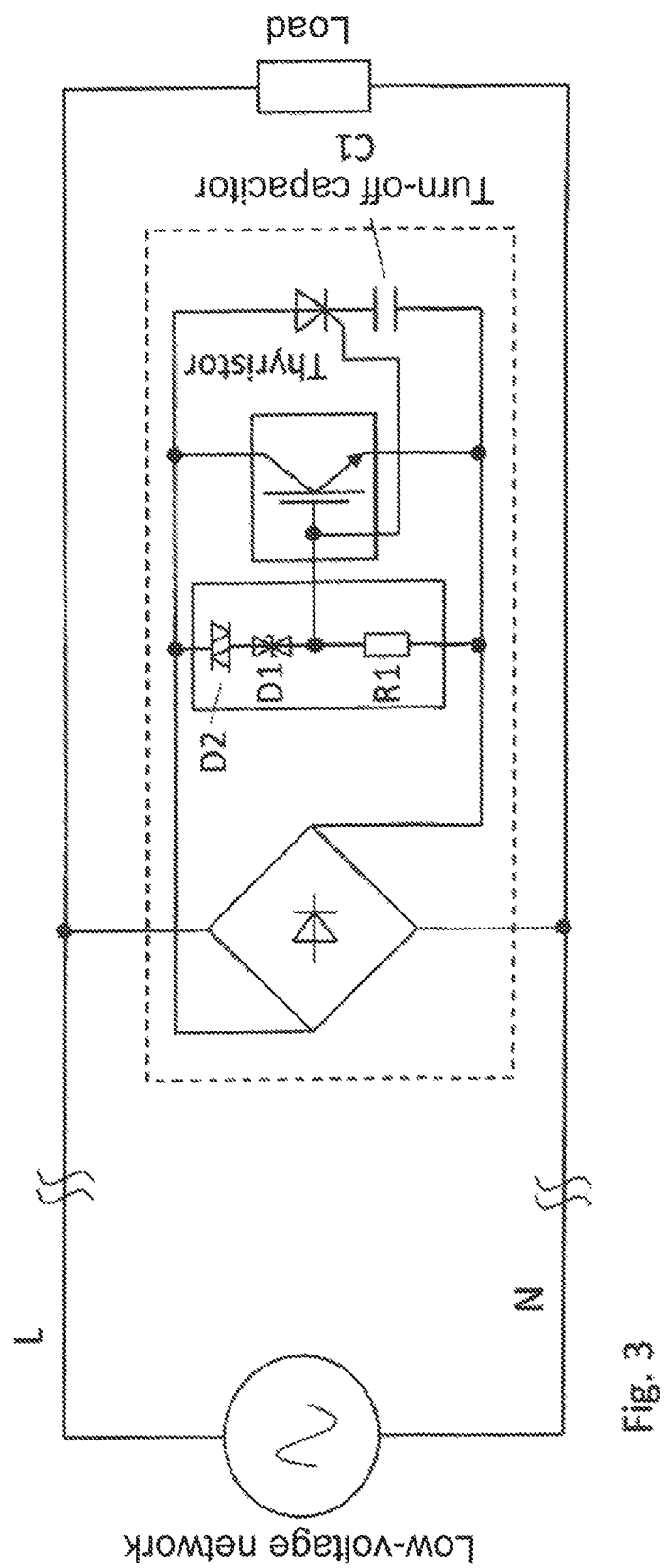

FIG. 1 a block diagram for protecting a unit against overvoltage, with an IGBT as a power semiconductor;

FIG. 2 an embodiment of the protection circuit which is fed via a diode bridge communicating with the input, and FIG. 3 a further embodiment of the protection circuit with a thyristor connected in parallel to the power semiconductor.

DETAILED DESCRIPTION OF THE INVENTION

As can be seen from FIG. 1, the circuit assembly according to the invention for protecting a unit to be operated from a supply voltage against overvoltage is composed of a power semiconductor, for example or preferentially an IGBT.

The power semiconductor comprises a series connection of a diac (bidirectional diode) and a Zener element ZE between its collector and its gate, with the sum of the Zener voltage and the diac voltage resulting in a clamping voltage for the power semiconductor IGBT, which lies above the voltage of the supply network and defines the protection level.

In the circuit assembly according to FIG. 2, on the other hand, a diac D2 is connected in series with a Zener element D1, with this series connection being situated between the gate and the collector of a semiconductor switch HS. In this embodiment, the control circuit further comprises a resistor R1 between the gate and emitter of the semiconductor switch HS. The resistor R1 serves the purpose of suppressing interferences in the gate, but also of discharging, and thus of turning off the transistor after an overvoltage event.

In addition, a diode bridge DB is present so that negative and positive overvoltage impulses can be processed. The supply network in FIGS. 2 and 3 is labelled with reference numeral 1 and the unit to be protected against overvoltage with reference numeral 2 (load).

In the representation according to FIG. 3, a control circuit analogous to that according to FIG. 2 is present, in turn comprising a diac D2 as well as a Zener element D1 and a semiconductor switch HS.

A thyristor TH is connected in parallel to the semiconductor switch HS.

Specifically, the thyristor's TH anode is connected to the collector, and the thyristor's TH cathode to the emitter of the power semiconductor HS, with the thyristor's TH gate communicating with the gate of the power semiconductor HS.

In the embodiment according to FIG. 3, a turn-off capacitor C1 is further provided between the thyristor's TH cathode and the emitter of the power semiconductor HS.

In this embodiment, the clamped semiconductor switch, in particular of an IGBT type, serves as a triggering unit for the thyristor, with the capacitor C1 causing a current discharge from the thyristor.

At the same time, the capacitor C1 can be used as an impulse evaluating unit.

In this regard, there is the option of performing a peak value acquisition of the impulse or a charge integration for obtaining the energy content of the interference impulse.

What is claimed is:

1. A circuit assembly for protecting a unit (2) to be operated from a supply network (1) against overvoltage, comprising an input having a first and a second input connection, which are connected to the supply network (1), and an output having a first and a second output connection, to which the unit (2) to be protected can be connected, and a protection circuit which is provided between the first and the second input connections in order to limit the voltage applied to the protection circuit, characterized in that the protection circuit has a power semiconductor (IGBT; HS), wherein a series connection of a Zener element (ZE) and at least one of a bidirectional diode (diac) and a thyristor diode is connected between the collector and the gate of the power semiconductor, wherein the sum of the Zener voltage and the diode voltage results in a clamping voltage for the power semiconductor (IGBT; HS), which lies above the voltage of the supply network (1) and defines the protection level;

characterized in that a thyristor (TH) is connected in parallel to the power semiconductor (HS); and characterized in that the thyristor's (TH) anode is connected to the collector, and the thyristor's (TH) cathode to the emitter of the power semiconductor (HS), with the thyristor's (TH) gate communicating with the gate of the power semiconductor (HS).

2. The circuit assembly according to claim 1, characterized in that the protection circuit is fed via a diode bridge (DB) communicating with the input so that negative but also positive overvoltage impulses can be dissipated.

3. The circuit assembly according to claim 1, characterized in that a turn-off capacitor (C1) is provided between the thyristor's (TH) cathode and the emitter of the power semiconductor (HS).

4. The circuit assembly according to claim 1, characterized in that the power semiconductor is an IGBT.

\* \* \* \* \*